US008026728B2

(12) United States Patent
Gorin et al.

(10) Patent No.: US 8,026,728 B2
(45) Date of Patent: Sep. 27, 2011

(54) SPECTRUM ANALYZERS WITH DYNAMIC RANGE INDICATOR AND METHODS OF USE

(75) Inventors: Joseph M. Gorin, Santa Rosa, CA (US); Corydon Joseph Boyan, Santa Rosa, CA (US)

(73) Assignee: Agilent Technologies, Inc., Santa Clara, CA (US)

(*) Notice: Subject to any disclaimer, the term of this patent is extended or adjusted under 35 U.S.C. 154(b) by 340 days.

(21) Appl. No.: 12/339,234

(22) Filed: Dec. 19, 2008

(65) Prior Publication Data

US 2010/0156438 A1    Jun. 24, 2010

(51) Int. Cl.
*G01R 23/20* (2006.01)
(52) U.S. Cl. .............. 324/624; 324/76.19; 702/117; 702/183; 702/195; 375/224; 375/226
(58) Field of Classification Search ........... 324/624, 324/76.19
See application file for complete search history.

(56) References Cited

U.S. PATENT DOCUMENTS

| | | | | |
|---|---|---|---|---|
| 4,578,638 A * | 3/1986 | Takano et al. | | 324/76.23 |
| 6,980,915 B2 * | 12/2005 | Gorin et al. | | 702/111 |
| 7,124,043 B2 * | 10/2006 | Stein et al. | | 702/76 |
| 7,310,504 B2 * | 12/2007 | Birgenheier et al. | | 455/226.1 |
| 7,315,172 B2 * | 1/2008 | Zeidan | | 324/614 |
| 7,791,329 B2 * | 9/2010 | Stein et al. | | 324/76.19 |
| 2002/0082792 A1 * | 6/2002 | Bourde et al. | | 702/107 |
| 2007/0233409 A1 * | 10/2007 | Boyan et al. | | 702/76 |
| 2007/0257660 A1 * | 11/2007 | Pleasant et al. | | 324/76.19 |
| 2008/0279268 A1 * | 11/2008 | Iwai et al. | | 375/227 |
| 2008/0298449 A1 * | 12/2008 | Yokoyama et al. | | 375/227 |
| 2009/0128123 A1 * | 5/2009 | Stein et al. | | 324/76.19 |

OTHER PUBLICATIONS

Symmetricom—5125A Phase Noise Test Set—"Operations and Maintenance Manual"—Part No. DOC05125A, Rev. A; Copyright 2009 Symmetricom Corporation; pp. 1, 2, 29 and 30.

* cited by examiner

*Primary Examiner* — Timothy J Dole
*Assistant Examiner* — Benjamin M Baldridge (57) ABSTRACT

An apparatus for measuring spectral components of a signal is described. The apparatus comprises a measurement acquisition unit configured to receive an input signal and to provide a measurement trace. The apparatus also comprises a model module configured to model one or more of a phase noise from the apparatus, a broadband noise from the apparatus, and a third order intermodulation (TOI) product from the apparatus. The apparatus also comprises a display configured to show one or more of the phase noise from the apparatus, the broadband noise from the apparatus, and the TOI product from the apparatus.

15 Claims, 8 Drawing Sheets

SPECTRUM ANALYZERS WITH DYNAMIC RANGE INDICATOR AND METHODS OF USE

BACKGROUND

A spectrum analyzer is a measurement device used to examine the spectral composition of waveforms, such as electrical, acoustic, or optical waveforms. Often spectrum analyzers are also configured to measure the power spectrum of the waveforms over a particular frequency range. There are two types of spectrum analyzers: analog spectrum analyzers and digital spectrum analyzers. Generally, an analog spectrum analyzer uses either a variable band-pass filter whose mid-frequency is automatically tuned (shifted, swept) through the range of frequencies of which the spectrum is to be measured or a superheterodyne receiver where the local oscillator is swept through a range of frequencies. Generally, a digital spectrum analyzer computes the discrete Fourier transform (DFT), a mathematical process that transforms a waveform into the components of its frequency spectrum.

More and more, spectrum analyzers are relied upon to provide accurate measurements of comparatively complex signals. For example, modern digital communications signals undergo comparatively complicated modulation schemes. These types of complex signals can tax the limits of performance of spectrum analyzers.

The performance of spectrum analyzers can be degraded by sources of signal distortion that are inherent within the spectrum analyzers. Thus, the spectrum analyzer can distort the spectrum of the signal under test (SUT). Notably, three sources of signal distortion are inherent to spectrum analyzers: broadband noise, phase noise and third order intermodulation (TOI) distortion. The noise sources result from, for example, local oscillators, frequency references and other components of the spectrum analyzer. The noise sources are power sums resulting from independent and uncorrelated processes. Thus, phase and broadband noise are scalars that add to the noise of the SUT. By contrast, TOI products from the spectrum analyzer are vectors that add to the TOI products of the SUT by coherent vector addition, leading to distortion of the TOI products of the SUT.

Noise and TOI products can reduce measurement accuracy of a spectrum analyzer when the noise and TOI products of the spectrum analyzer cannot be isolated from signal measurements that are performed by the spectrum analyzer. These noise and TOI products can also limit measurement sensitivity of the spectrum analyzer. If the noise and TOI products of the spectrum analyzer are sufficiently high relative to the signals being measured, the signals can be masked by the noise and TOI products of the spectrum analyzer and go undetected by the spectrum analyzer. Unfortunately, decreasing the noise of the spectrum analyzer and reducing the TOI products to improve the measurement accuracy and measurement sensitivity can be costly or difficult to achieve.

SUMMARY

In accordance with a representative embodiment, an apparatus for measuring spectral components of a signal comprises: a measurement acquisition unit configured to receive an input signal and to provide a measurement trace; a model module configured to model one or more of a phase noise from the apparatus, a broadband noise from the apparatus, and a third order intermodulation (TOI) product from the apparatus; and a display configured to show one or more of the phase noise from the apparatus, the broadband noise from the apparatus, and the TOI product from the apparatus.

In accordance with another representative embodiment, a method of displaying a measurement of a spectrum of a signal. The method comprises: measuring one or more of a phase noise, a broadband noise and a third order intermodulation (TOI) product of a signal under test (SUT); modeling one or more of a phase noise, a broadband noise and a TOI from a spectrum analyzer; and displaying the selected one or more of the phase noise, the broadband noise and the TOI product of both the SUT and the spectrum analyzer.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

It is to be understood that the terminology used herein is for purposes of describing particular embodiments only, and is not intended to be limiting.

As used in the specification and appended claims, the terms 'a', 'an' and 'the' include both singular and plural referents, unless the context clearly dictates otherwise. Thus, for example, 'a device' includes one device and plural devices.

DETAILED DESCRIPTION

In the following detailed description, for purposes of explanation and not limitation, illustrative embodiments disclosing specific details are set forth in order to provide a thorough understanding of the present teachings. Moreover, descriptions of well-known devices, hardware, software, firmware, methods and systems may be omitted so as to avoid obscuring the description of the illustrative embodiments. Nonetheless, such hardware, software, firmware, devices, methods and systems that are within the purview of one of ordinary skill in the art may be used in accordance with the illustrative embodiments. Finally, wherever practical, like reference numerals refer to like features.

The detailed description which follows presents methods that may be embodied by routines and symbolic representations of operations of data bits within a computer readable medium, associated processors, microprocessors, digital storage oscilloscopes, general purpose personal computers, manufacturing equipment, configured with data acquisition cards and the like. In general, a method herein is conceived to be a sequence of steps or actions leading to a desired result, and as such, encompasses such terms of art as "routine," "program," "objects," "functions," "subroutines," and "procedures."

The apparatuses and methods of the illustrative embodiments are described in implementations in a measurement system including one or more testing devices (e.g., spectrum analyzers and 'one-box-testers' (OBTs)). Machines that may perform the test functions according to the present teachings include those manufactured by companies such as AGILENT TECHNOLOGIES, INC., and TEKTRONIX, INC. as well as other manufacturers of test and measurement equipment.

With respect to the software useful in the embodiments described herein, those of ordinary skill in the art will recognize that there exist a variety of platforms and languages for creating software for performing the procedures outlined herein. Certain illustrative embodiments can be implemented using any of a number of varieties of operating systems (OS) and programming languages. For example, the OS may be a commercially available OS from Microsoft Corporation, Seattle, Wash., USA, or a Linux OS. The programming language may be a C-programming language, such as C++, or Java.

Figure 1A:
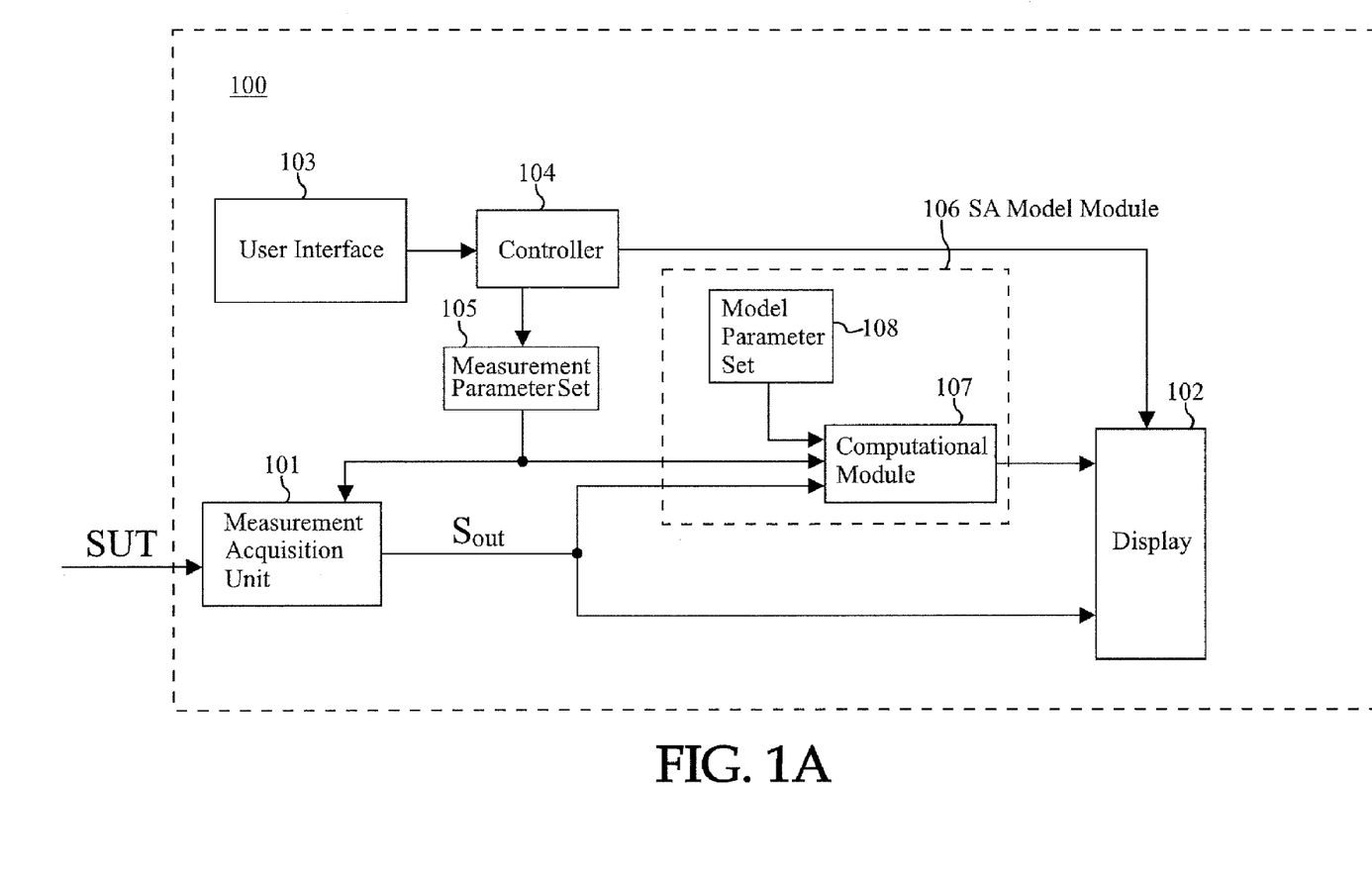
FIG. 1A shows a simplified schematic block diagram of spectrum analyzer in accordance with a representative embodiment.

FIG. 1A shows a simplified schematic block diagram of a spectrum analyzer 100 in accordance with a representative embodiment. While the representative embodiments describe the function of the present teachings in the context of a spectrum analyzer, other apparatuses are contemplated, especially those useful in taking measurements of spectra from a signal or sample. For example, the present teachings are contemplated for use in oscilloscopes comprising fast Fourier transform (FFT) analysis features; and in OBTs commonly used in spectral analysis of communications devices such as mobile phones. Moreover, the present teachings are contemplated for use in devices to analyze the spectrum of a sound card, music or other types of files.

The spectrum analyzer 100 comprises a measurement acquisition unit 101, a display 102, a user interface 103 and a controller 104, and a parameter set 105. Moreover, the spectrum analyzer 100 comprises a model module 106, which is configured to provide a model of one or more of: broadband (BB) noise, phase ((P) noise, and third order intermodulation (TOI) products that are due to the spectrum analyzer 100. In a representative embodiment, and as described more fully herein, the results of the models are provided to the display 102 and allow a user to selectively determine the portion of the spectrum noise and TOI products that are due to the signal under test (SUT) and those due to the spectrum analyzer 100. By displaying the results of the models on the display 102, the user can be apprised of one or more of the BB noise, phase noise and TOI products contributions by the spectrum analyzer 100, and, beneficially the user is more readily apprised of interference with measurement accuracy of a SUT.

The controller 104 is typically a computer or other type of processor, that is coupled to a keyboard, touch screen, or other type of user interface 103. The user interface 103 can also be a computer that is coupled to the spectrum analyzer 100 via an interface bus or other communication path. Notably, the communication path may be wired or wireless, and the user interface 103 may be remote to the apparatus. Furthermore, the user interface 103 may comprise a graphic user interface (GUI).

The user interface 103 provides an input to the controller 104. Based on the input, the controller 104 is configured to adjust the operating state of the spectrum analyzer 100. The operating state includes the center frequency CF, the frequency span SPAN, and resolution bandwidth RBW settings for a measurement acquisition unit 101 of the spectrum analyzer 100. However, there may be additional operating states, or operating states that are different from these exemplary operating states, depending on the measurement acquisition unit 101 of the spectrum analyzer 100. The measurement acquisition unit 101 includes the components, elements, or subsystems, or combinations thereof used to characterize the spectral content of input signals (SUT) that are applied to the spectrum analyzer 100. The measurement acquisition unit 101 may be such as instantiated in a conventional spectrum analyzer 10, such as an AGILENT TECHNOLOGIES, INC. model E4440 PSA series Spectrum Analyzer that includes an offset synthesizer SYNTH. The offset synthesizer SYNTH provides a local oscillator signal $S_{LO}$ that establishes the center frequency CF and frequency span SPAN for the measurements performed by the spectrum analyzer. A filter (not shown) establishes the resolution bandwidth RBW for the measurements performed by the spectrum analyzer. The operation of a conventional spectrum analyzer is described, for example, in Spectrum Analysis Basics, Application Note 150, provided by AGILENT TECHNOLOGIES, INC., Palo Alto, Calif., USA, the disclosure of which is specifically incorporated herein by reference. Additional details of the measurement acquisition unit 101 and its functions may be found in commonly owned U.S. Pat. No. 6,980,915 (Gorin, et al.) and U.S. Pat. No. 7,035,324 (Mar, et al.), the disclosures of which are specifically incorporated herein by reference.

The operating states of the spectrum analyzer 100 are set according to parameters within a designated parameter set 105 associated with the spectrum analyzer 100. The parameters of the parameter set 105 of a representative embodiment influence the broadband noise, the phase noise $\phi N$ and the TOI products of the spectrum analyzer 100. The parameters are adjusted, set or otherwise designated via the controller 104 in response to the inputs provided by the user interface 103.

An illustrative parameter set 105 designates the operating states of a spectrum analyzer 100 that includes an offset synthesizer SYNTH in the measurement acquisition unit 101. As noted above, the parameters of the parameter set 105 impact the broadband and phase noise $\phi N$, and TOI products of the apparatus. Thus, when the signal SUT is measured by the spectrum analyzer 100, the parameter settings that designate the operating state of the spectrum analyzer 100 for the measurement also establish the phase noise and TOI products that are contributed to the measurement by the spectrum analyzer 100. Furthermore, when the SUT is measured by the spectrum analyzer 100, broadband noise is contributed by the spectrum analyzer 100. Ultimately, the phase noise, the broadband noise and the TOI products have components from both the input signal SUT, and from the spectrum analyzer.

Illustratively, and as described in the patent to Gorin, et al., a subset of the parameter set comprises the sampler IF frequency (intermediate frequency) $f_{SIF}$, sampler IF polarity P, sampler harmonic number N and PLL (phase lock loop) divide ratio R within the offset synthesizer SYNTH of the measurement acquisition unit 101. This illustrative subset of parameters influences the phase noise. Another parameter, the input attenuator setting, increases input attenuation and increases the input-referred broadband noise. Illustratively, for each increase in attenuation of 1 dB, the input-referred broadband noise increases by 1 dB; and the TOI products decrease by 2 dB. Accordingly, the broadband noise degrades and the TOI products improve. Beneficially, there is a setting that minimizes the sum of these effects, and the DRI facilitates its locating.

In accordance with representative embodiments, the contributions of one or more of the phase noise, the broadband noise and the TOI products are provided to the display 102. Thereby, the user can selectively view both the uncorrected output signal $S_{OUT}$ and the contributions of one or more of the phase noise and the broadband noise to $S_{OUT}$ from the spectrum analyzer 100 at the display 102. Examples of the display 102 showing the uncorrected and corrected signals are described more fully below.

The model module 106 comprises a computational unit 107 and a model parameter set 108. While the model module 106 comprising the computational unit 107 and the model parameter set 108 are shown separate from the controller 104, it is contemplated by the present teachings that the model module 106, the computational unit 107 and the model parameter set 108 be implemented within the controller 104. As discussed more fully below, the computational unit 107 computes the modeled phase noise, the broadband noise and the TOI products contributed to the SUT by the measurement acquisition unit 101 immediately, and by the spectrum analyzer 100 ultimately. These contributions are modeled using known mathematical modeling methods.

Figure 1B:
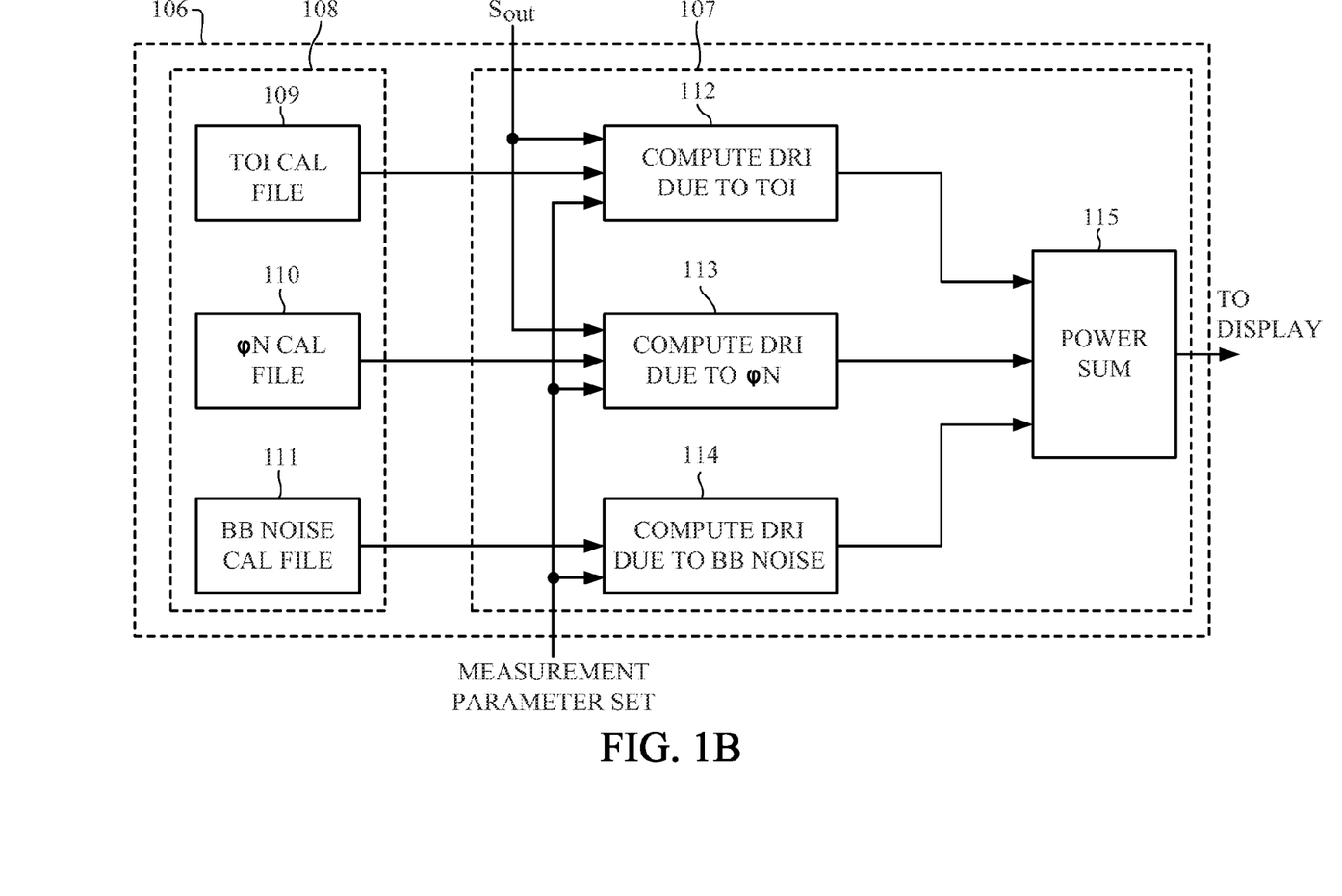
FIG. 1B shows a simplified schematic block diagram of a model module of a spectrum analyzer in accordance with a representative embodiment.

The model module 106 is shown in greater detail in FIG. 1B. The model parameter set 108 comprises a TOI Cal file 109, a phase noise Cal file 110 and a broadband noise Cal file 111. Each Cal file 109, 110, 111 is instantiated in memory (e.g., in look-up tables) and comprises parameters useful in estimating the respective contributions from the spectrum analyzer 100 to TOI products, phase noise and broadband noise. For example, the phase noise parameters may be gathered according to the methods described in the referenced patent to Gorin, et al. Moreover, the broadband noise may be modeled based on known noise versus frequency behavior of the particular spectrum analyzer being used. Likewise, the TOI Cal file 109 comprises the parameters indicative of the contributions by various elements of the spectrum analyzer to TOI products. These contributions are selected based on the signal path chosen and the frequency of operation.

The parameters from the respective Cal files 109, 110, 111 may be updated routinely, and are provided to respective computational units of the computational unit 107 for the computation of updated modeled noise and TOI products from the spectrum analyzer 100. In particular, the parameters from the TOI Cal file 109 are provided to the Computation DRI (TOI) unit 112; the parameters from the phase noise Cal file 110 are provided to the Computation DRI (φN) unit 113; and the parameters from the BB Cal file 111 are provided to the Computation DRI (BB) unit 114. Each unit 112, 113, 114 comprises software and is configured to calculate the models for the respective TOI products, phase noise products and broadband noise products contributed by the spectrum analyzer 100 and based on parameters from the respective Cal files 109, 110, 111.

In a representative embodiment, the phase noise model is a model of noise (e.g., in units of dBc/Hz) versus offset frequency and is calculated according to the teachings of Gorin, et al. The broadband noise, which is also referred to as the noise floor of the spectrum analyzer 100, is modeled by known methods, such as described in the referenced applications above. Once the span and number of points or measurement cells (often referred to as 'buckets') are known, that models can be converted into a trace for depiction on the display 102. Given the RBW (and detector), that trace can be converted to dB units. It can then be convolved with the actual trace to create the required piece of the DRI trace. Additional details of the depiction of the phase noise model are provided in connection with FIGS. 3A-3C and 5A-5B below.

The TOI products contributed by the spectrum analyzer are more complicated to model than the noted noise models. As is known, intermodulation occurs when the input to a non-linear system or device is composed of two or more frequencies. For example, the amplification of a signal with two frequency components will create such products. In general, each of the TOI products will have a different amplitude and phase, which depend on the specific non-linear function being applied, and also on the amplitudes and phases of the original input components. However, unlike the contribution of phase noise and broadband noise, which are simply scalar addition of power values, TOI products are vectors and will add to the components in the input signal with a coherent phase.

In accordance with representative embodiment, the TOI products contributed by the spectrum analyzer 100 are estimated for indication on the display of the spectrum analyzer 100. Generally, to garner the modeled TOI products contributed by the spectrum analyzer 100, the spectrum is convolved with itself, then convolved again with itself, then adjusted for the third-order intercept of the analyzer. The two convolutions serve to create an amplitude spectrum that has power elements proportional to the cube of the input amplitude. As should be appreciated by one of ordinary skill in the art, cube-law behavior is a feature of TOI products. The "adjustment" is a multiplication manifest as an offset in decibels to ensure that two tones having an amplitude at the third-order intercept create intermodulation products at that same amplitude. As such, the intercept is that level at which a graph of the intermodulation products versus level crosses a graph of the signal elements versus level.

The models derived at the respective computation units 112, 113, 114 are individual DRI traces over the spectrum being displayed. These traces comprise the DRI and are provided to a power summer 115 for power summation to create the single trace. Notably, the power summation need not include all of TOI, φN and BB noise traces. Illustratively, if desired, the one or more models not to be displayed may be input as a null value to the power summer 115. The selected one or more models of the phase noise, broadband noise and TOI products for the spectrum analyzer for the dynamic range of the spectrum analyzer 100 are calculated as described, summed by the power summer 115 and are provided to the display 102. The controller 104 communicates these to the display 102 for inclusion therein with $S_{OUT}$.

According to certain embodiments, once a spectrum of an SUT is displayed on the display 102, the RBW can be updated, or the attenuation of the input signal SUT can be changed. To maintain measurement accuracy, in accordance with representative embodiments, and as described more fully below in conjunction with FIG. 6 below, a DRI region comprising the displayed models of phase noise, broadband noise and TOI products from the spectrum analyzer 100 is updated when updates to RBW, or attenuation, or both occur. These and other types of state changes may occur at the end of most sweeps, prompting an update of the DRI region displayed even if a new signal trace is not displayed. Moreover, less frequent updating can be effected when averaging is on: at the end of the first sweep and the first time the number of averages reaches a predetermined goal. Additionally, or alternatively, the DRI trace is updated upon a new measurement trace only if the DRI trace is older than a particular time (e.g., one second). The updating of the models is effected by providing germane parameters germane to the circumstances (e.g., RBW or Attenuation) from the Cal files 109, 110, 111 to respective Computation units 112, 113, 114 and providing an updated power sum to the controller 104.

Figure 2A:
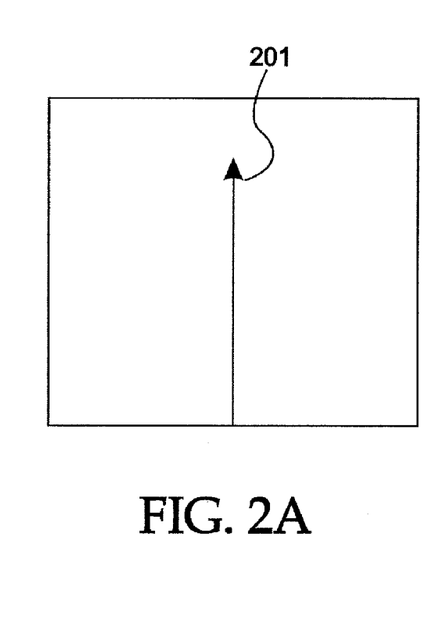
FIGS. 2A-2C show graphical representations of spectra in accordance with a representative embodiment.
Figure 2B:
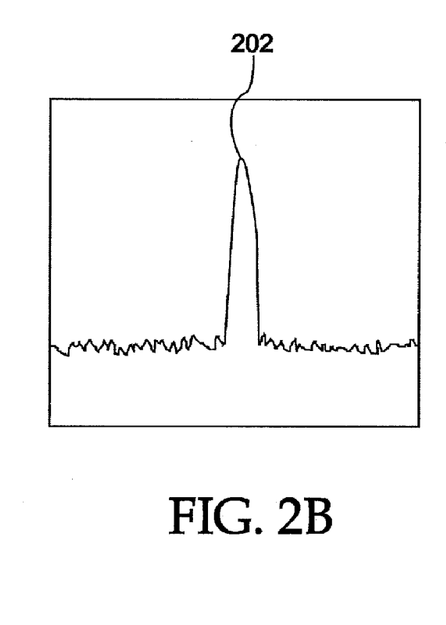
Figure 2C:
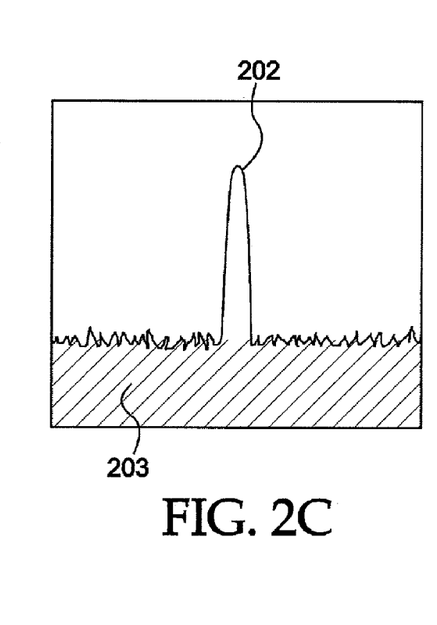

Once the updates are calculated by the computational unit 107 of the model module 106, the controller 104 provides the one or more of updated phase noise, the broadband noise, and the TOI products contributed by the spectrum analyzer 100 to the display 102. The display 102 is configured by the controller 104 to show the updated DRI region FIGS. 2A-2C show graphical representations of spectra in accordance with a representative embodiment. FIGS. 2B and 2C are, for example, show typical displays of the dynamic range of an SUT provided on display 102.

FIG. 2A shows an ideal spectrum of a single frequency SUT 201 depicted in the frequency domain. FIG. 2B shows a more common representation of the SUT of FIG. 2A. As can be appreciated, the spectrum 202 would be provided on the display 102 taking the RBW shape including the broadband noise of both the SUT and the spectrum analyzer.

FIG. 2C shows the SUT 202 on the display 102 in accordance with a representative embodiment. Notably, the RBW of the Spectrum Analyzer 100 is shown with the contribution of the broadband noise 203 from the spectrum analyzer 100 provided by the model module 106. While the present depiction of the spectrum does not comprise a corrected spectrum with the contribution from the spectrum analyzer 100 compensated at each frequency, one skilled in the art can garner a clearer understanding of the contribution of noise in the analyzer, as filtered by the RBW filter, at each frequency of the spectrum.

Figure 3A:
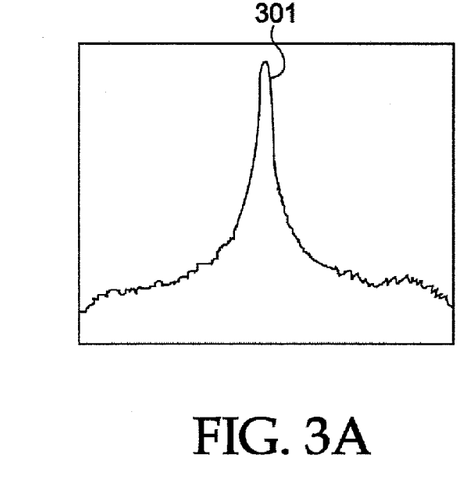
FIGS. 3A-3C show graphical representations of spectra in accordance with a representative embodiment.
Figure 3B:
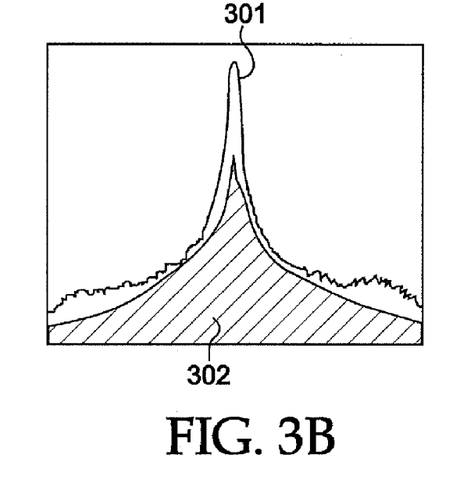
Figure 3C:
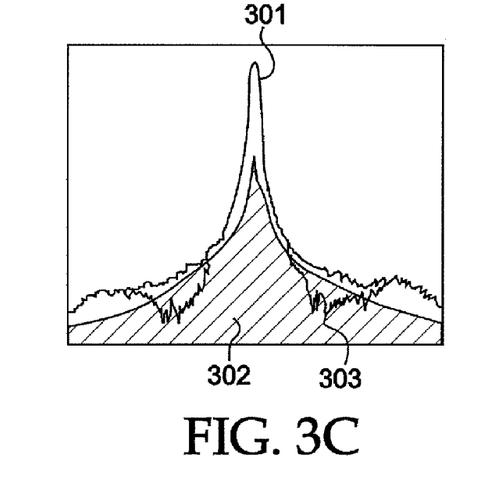

FIGS. 3A-3C show graphical representations of spectra in accordance with a representative embodiment. These graphical representations are, for example, displays of the dynamic range with which a spectrum analyzer 100 can measure the SUT.

FIG. 3A shows the spectrum 301 of an SUT, including the phase noise due to both the SUT and the spectrum analyzer. Such a spectrum would be displayed on the display 102 without compensation or indication of the sources of the phase noise.

FIG. 3B shows the spectrum 301 with the modeled spectral contribution 302 due to phase noise energy from the spectrum analyzer 100. The modeled spectral contribution 302 is computed by the model module 106. With the modeled phase noise contribution from the module 106 distinguished on the display 102, the dynamic range indicator is provided by the modeled spectral contribution 302, and the user can differentiate more clearly the sources of phase noise. In the present characterization, the user can determine from the display 102 that at mid-frequency offsets from the carrier of the SUT, the phase noise of the analyzer dominates; while closer-in and at wider offsets the DUT phase noise dominates.

FIG. 3C includes the corrected signal spectrum 303, with a phase noise compensation function applied in the spectrum analyzer 100. In particular, the phase noise compensation function displays not only the modeled spectral contribution 302, providing a dynamic range indicator of the SUT, but also displays the phase-noise contribution from the spectrum analyzer as compensated. As described above, because the noise energy is a scalar, the corrected signal spectrum 303 is determined by subtracting the modeled phase noise power from the overall power to predict what the spectrum would measure if the spectrum analyzer 100 were ideal and had no phase noise.

Figure 4A:
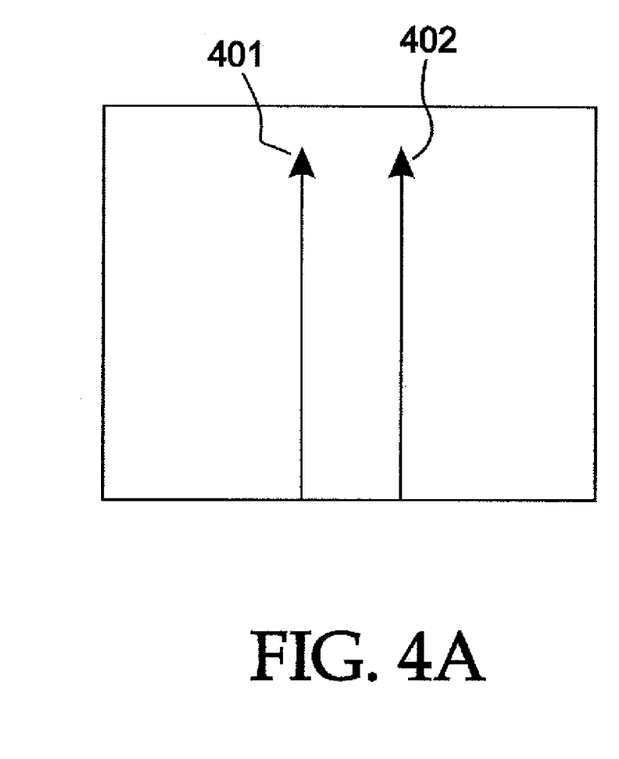
FIGS. 4A-4B show graphical representations of spectra in accordance with a representative embodiment.
Figure 4B:
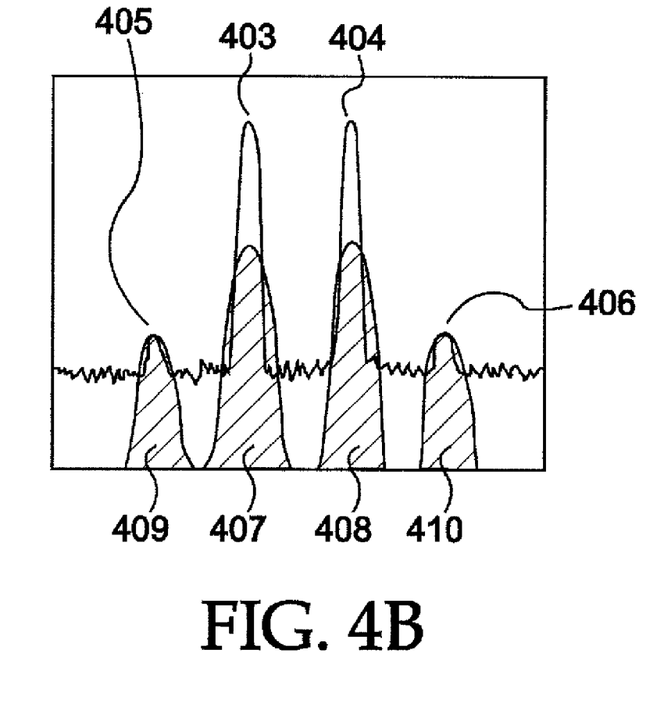

FIGS. 4A-4B show graphical representations of spectra in accordance with a representative embodiment. FIG. 4B, for example, displays of the dynamic range of an SUT provided on display 102.

FIG. 4A shows an ideal spectrum for spectral components 401, 402 of an SUT in the frequency domain. As should be appreciated, these components may intermodulate due to convolution in a non-linear device or element.

FIG. 4B shows a graphical representation showing the TOI products 403, 404, 405, 406 due with contributions from both the signal analyzer 100 and the SUTs. The TOI products 407 and 408 are the modeled TOI products of contributions from the spectrum analyzer 100. Moreover, TOI products 409 and 410 are also modeled TOI products from the spectrum analyzer 100. The modeled products 407-410 are computed by the model module 106 and provided on the display 102. As should be appreciated from a review of FIG. 4B, the TOI products 405, 406 are due primarily from the contribution from the spectrum analyzer 100 to the total TOI product. Thus, a user could determine from a review of the display 102 depicting the spectrum of FIG. 4B that the spectrum of the SUT possibly provides no TOI products at these frequencies, and all TOI products are from the spectrum analyzer.

Figure 5A:
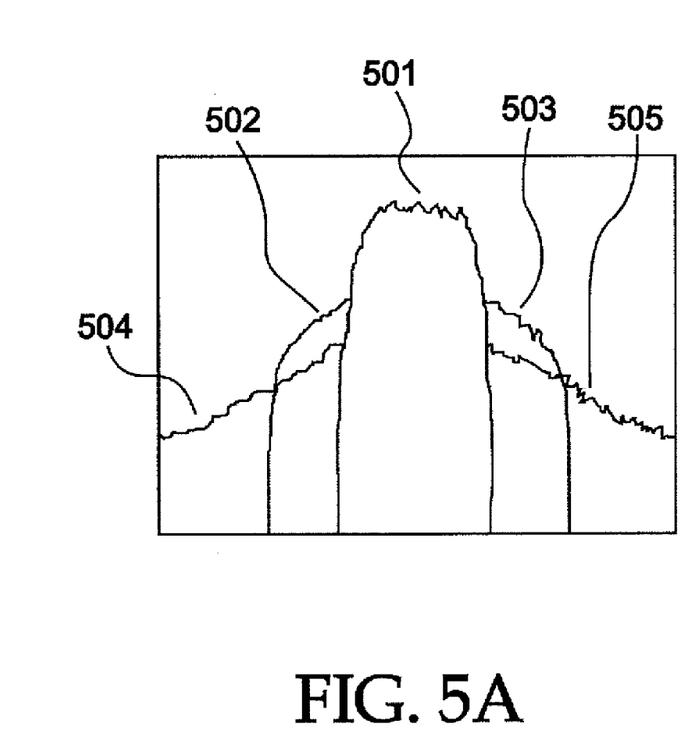
FIGS. 5A-5B show graphical representations of spectra in accordance with a representative embodiment.
Figure 5B:
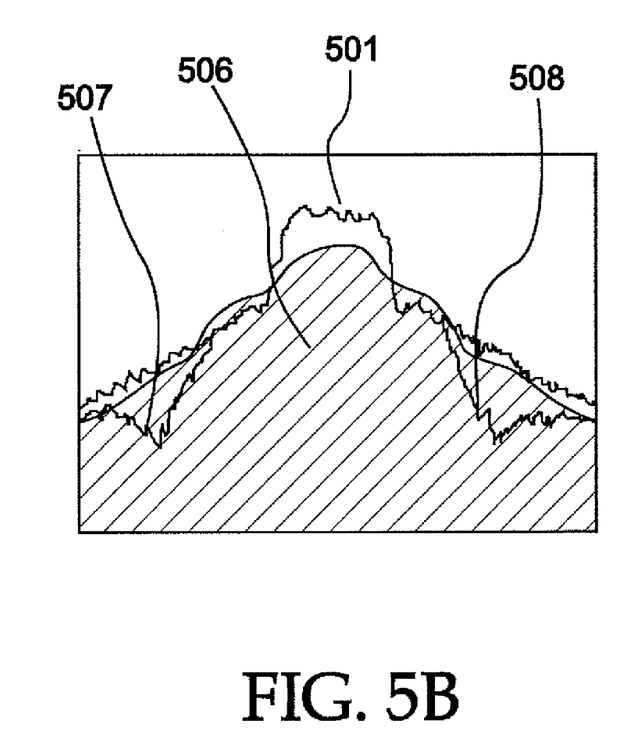

FIGS. 5A-5B show graphical representations of spectra in accordance with a representative embodiment. These graphical representations are, for example, displays of the dynamic range of an SUT provided on display 102.

FIG. 5A shows the spectrum of a highly modulated signal that is typical of signals found in many digital communications systems. A spectrum 501 of an SUT comprises phase noise, broadband noise and TOI products from both the spectrum analyzer and the SUT. The two 'wings' 502, 503 are indicative of the TOI products from the spectrum analyzer and from the SUT; and the regions 504, 505 are indicative of the phase noise of the SUT and spectrum analyzer.

FIG. 5B shows the spectrum 501 with phase noise and broadband noise depicted as hatched region 506 determined from models from the model module 106 according to representative embodiments described above. A corrected spectrum is shown by regions 507, 508 of a trace in FIG. 5B. The corrected spectrum comprises a correction or compensation determined by calculating a difference in the total phase noise and the phase noise from the spectrum analyzer 100. This difference, which is shown as regions 507, 508, reveals that the phase noise due to the spectrum analyzer 100 dominates the phase noise, and a more accurate depiction of the phase noise from the SUT. Thus, the regions 507, 508 show how phase noise subtraction on the display 102 allows for the measure of spectrum 501 below the floor provided by the regions 504, 505.

Figure 6:
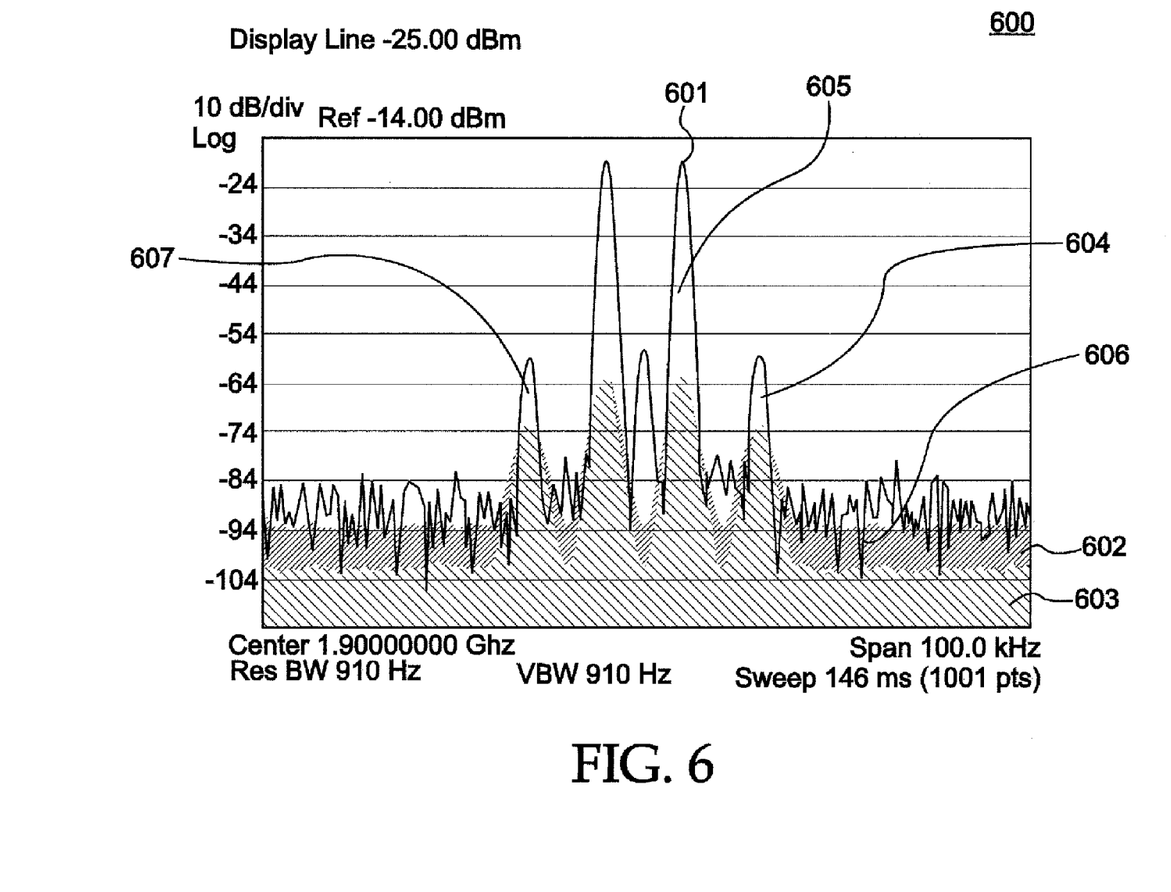
FIG. 6 depicts a display output of a signal analyzer in accordance with a representative embodiment.

FIG. 6 depicts a display output 600 of a signal analyzer 100 in accordance with a representative embodiment. The various frequencies, frequency ranges, sweep duration and power levels are provided only as illustrations and are not limiting. The measured trace 601 comprises the power for a SUT, including sources of noise and TOI products from both the SUT and the spectrum analyzer 100. The region 602 represents the modeled or predicted contributions of noise from the analyzer 100. These predicted contributions are for the case of when compensations (noise compensations and phase noise compensations) are not in place. Without these compensations, the measured signal ideally will always be above the region 602, because the signal analyzer 100 measures the sum of the SUT power and the analyzer-contributed noise powers, which can only be higher than the analyzer-contributed noise powers alone.

When noise compensation and/or phase noise compensations are applied, the post-compensated trace can fall into the region 602. The region 602 is approximately 8 dB wide when it is dominated by broadband noise, because the broadband noise compensations are approximately 8 dB according to the representative embodiment shown in FIG. 6. As such, approaching the region 602 means the contributions to noise from the spectrum analyzer dominate, and due to the limits of modeling, the trace 601 should not extend more than approximately one dB into region 602. Region 603 shows a region that for a signal trace such as trace 601, if the signal trace is compensated for phase noise and broadband noise, and the signal trace is well above the upper limits of region 603, the accuracy of the signal trace is comparatively high. If the compensated signal trace is closer to the upper limits of region 603 or if the compensated signal extends into region 603, its accuracy is suspect. Thus, as discussed previously, the representative embodiment beneficially accords the user the ability to discern accuracy of the signal trace on the display.

While compensation for noise may be implemented, presently no compensation for TOI products is provided, and as such there is no differential between regions 602 and 603 for TOI contributions. Moreover, TOI interaction between the SUT and the signal analyzer are coherent, so the measured signal can easily be measured to be inside regions 602 and 603, whenever the TOI products in the SUT and those in the analyzer combine destructively.

As should be appreciated by one of ordinary skill in the art, the display 600 beneficially accords certain accuracies and with knowledge of the limitations of compensation, the user can garner a better understanding of the limitations of the signal analyzer. For example, when the trace 601 is found at power levels well above either the region 602 or region 603, the accuracy of the measurement is comparatively high as the modeled contributions of the phase noise, broadband noise and TOI products have power levels well below the power level of the SUT. The same is true in regions 604, 605 and 607, for example. However, at region 606, where the trace 601 extends into regions 602 or 603, there is significantly less accuracy as to the source of noise is from the SUT. Rather, the contribution to the noise can be from the spectrum analyzer 100.

Figure 7:
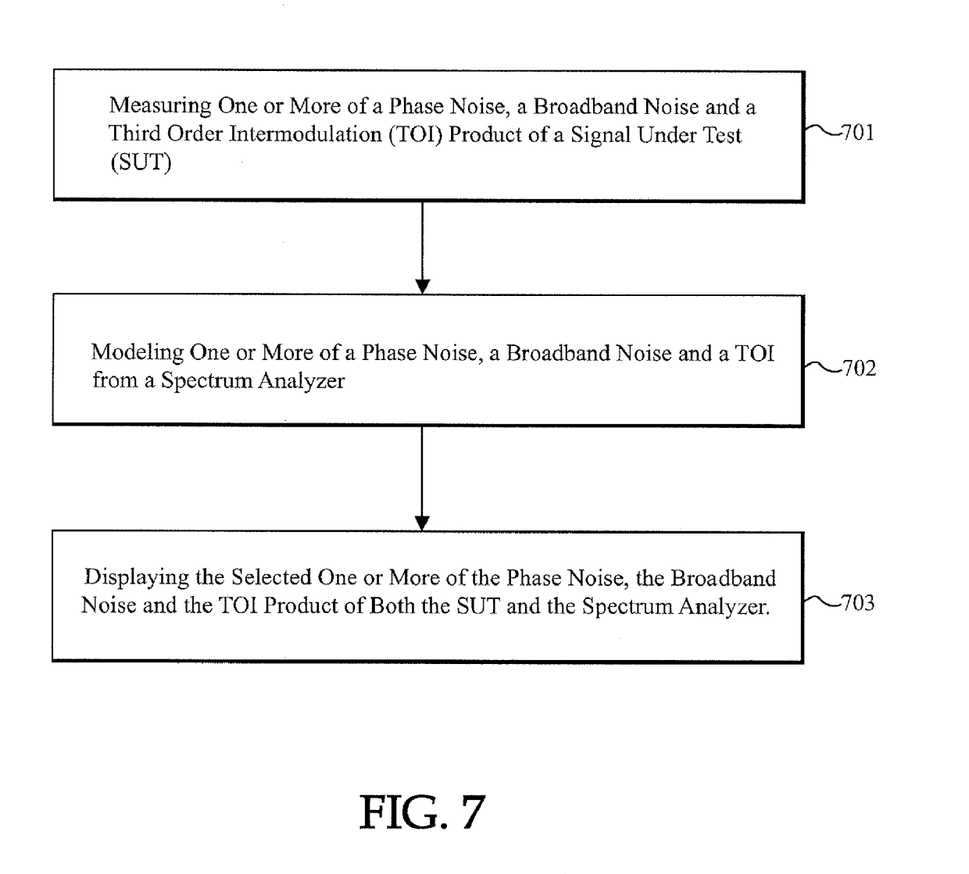
FIG. 7 shows a flow-chart of a method in accordance with a representative embodiment.

FIG. 7 is a flow-chart of a method of displaying a measurement of a spectrum of a signal in accordance with a representative embodiment. Many of the details of embodiments described in connection with FIGS. 1-6 above are common to the presently described method. Many of these common details are not repeated to avoid obscuring the description of the illustrative method. At 701, the method comprises measuring a signal which may include one or more of: added broadband noise, added phase noise, or introduced third-order intermodulation products. These features may be due to a DUT acting on a near-perfect signal, or may be features of the generated signal itself. At 702, the method comprises modeling one or more of a phase noise, a broadband noise and a TOI from a spectrum analyzer. At 703, the method comprises displaying the selected one or more of the phase noise, the broadband noise and the TOI product of both the SUT and the spectrum analyzer.

In view of this disclosure it is noted that the methods and devices can be implemented in keeping with the present teachings. Further, the various components, hardware, software, firmware and parameters are included by way of illustration and example only and not in any limiting sense. In view of this disclosure, those skilled in the art can implement the present teachings in determining their own applications and needed components, hardware, software, firmware and parameters, to implement these applications, while remaining within the scope of the appended claims.

The invention claimed is:

1. An apparatus for measuring spectral components of a signal, the apparatus comprising:
a measurement acquisition unit that receives an input signal and to provide a measurement trace;
a model module that models one or more of a phase noise from the apparatus and a broadband noise from the apparatus, and that models a third order intermodulation (TOI) product from the apparatus; and
a display that shows one or more of the phase noise from the apparatus, the broadband noise from the apparatus, and the TOI product from the apparatus.

2. An apparatus as claimed in claim 1, wherein the model module unit further comprises:
a first cal file comprising a first set of parameters;
a first computation unit that receives at least a subset of the parameters from the first cal file, and that calculates one of the phase noise, the broadband noise or the TOI product.

3. An apparatus as claimed in claim 2, wherein the model module unit further comprises:
a second cal file comprising a second set of parameters;
a second computation unit that receives at least a subset of the parameters from the second cal file, and that calculates another of the phase noise, the broadband noise or the TOI product.

4. An apparatus as claimed in claim 3, wherein the model module unit further comprises:
a third cal file comprising a third set of parameters;
a third computation unit that receives at least a subset of the parameters from the third cal file, and that calculates another of the phase noise, the broadband noise or the TOI product.

5. An apparatus as claimed in claim 4, wherein the first cal file comprises a TOI cal file, the second cal file comprises a phase noise cal file, and the third cal file comprises a broadband noise cal file.

6. An apparatus as claimed in claim 5, wherein the first computation unit comprises a TOI computation unit, the second computation unit comprises a phase noise computation unit, and the third computation unit comprises a broadband noise computation unit.

7. An apparatus as claimed in claim 1, wherein the measurement acquisition unit provides a resolution bandwidth (RBW) based on a user input.

8. An apparatus as claimed in claim 1, wherein the measurement acquisition unit provides a signal attenuation based on a user input.

9. An apparatus as claimed in claim 8, wherein, based on an update of the RBW, the computational unit updates one or more of the phase noise, the broadband noise and the TOI product of the apparatus, and the display shows the updated phase noise, the broadband noise, or the TOI product, or a combination thereof.

10. An apparatus as claimed in claim 8, wherein, based on a signal attenuation, the computational unit updates one or more of the broadband noise and the TOI product of the apparatus, and the display shows the updated phase noise, the broadband noise, or the TOI product, or a combination thereof.

11. An apparatus as claimed in claim 1, wherein the apparatus comprises one of:
a spectrum analyzer, and an oscilloscope.

12. A method of displaying a measurement of a spectrum of a signal, the method comprising:
measuring one or more of a phase noise and a broadband noise;
measuring a third order intermodulation (TOI) product of a signal under test (SUT);
modeling one or more of a phase noise, a broadband noise from a spectrum analyzer;

modeling a TOI product from the spectrum analyzer; and
displaying the selected one or more of the phase noise, the broadband noise and the TOI products of both the SUT and the spectrum analyzer.

13. A method as claimed in claim 12, further comprising:
providing a first resolution bandwidth for the SUT;
providing a second resolution bandwidth for the SUT;
updating the modeling for the second resolution bandwidth; and
displaying the updated one or more of the phase noise, the broadband noise and the TOI products from the spectrum analyzer.

14. A method as claimed in claim 12, further comprising:
providing a first attenuation to the SUT;
providing a second attenuation to the SUT;
updating the modeling for the second attenuation; and
displaying the one or more of the phase noise, the broadband noise and the TOI products from the spectrum analyzer.

15. An apparatus for measuring spectral components of a signal, the apparatus comprising:
a measurement acquisition unit that receives an input signal and to provide a measurement trace;
a model module that models one or more of a phase noise from the apparatus, a broadband noise from the apparatus, and that models a third order intermodulation (TOI) product from the apparatus, wherein the model module comprises: a controller and a computational unit that models the phase noise, the broadband noise and the TOI products over a frequency range and a power level range of the signal; and
a display that shows one or more of the phase noise from the apparatus, the broadband noise from the apparatus, and that shows the TOI product from the apparatus.

* * * * *